United States Patent [19]

Bracco et al.

[11] Patent Number: 4,536,944

[45] Date of Patent: Aug. 27, 1985

[54] METHOD OF MAKING ROM/PLA SEMICONDUCTOR DEVICE BY LATE STAGE PERSONALIZATION

[75] Inventors: Al M. Bracco, Reston; Arthur R. Edenfeld; Harish N. Kotecha, both of Manassas, all of Va.

[73] Assignee: International Business Machines Corporation, Armonk, N.Y.

[21] Appl. No.: 454,315

[22] Filed: Dec. 29, 1982

[51] Int. Cl.³ .................. H01L 21/26; H01L 21/265
[52] U.S. Cl. ................................. 29/571; 29/576 B; 148/1.5; 148/187; 357/23.5; 357/23.12; 357/23.6; 357/91
[58] Field of Search .............. 148/1.5, 187, 195; 29/571, 576 B; 357/23 VT, 23 D, 23 C, 91

[56] References Cited

U.S. PATENT DOCUMENTS

| 4,235,011 | 11/1980 | Butler et al. ........................ 29/571 |
| 4,282,646 | 8/1981 | Fortino et al. ...................... 29/571 |
| 4,356,623 | 11/1982 | Hunter ................................ 29/571 |
| 4,366,613 | 1/1983 | Ogura et al. ........................ 29/571 |
| 4,380,866 | 4/1983 | Countryman, Jr. et al. ...... 29/577 C |
| 4,406,049 | 9/1983 | Tam et al. ........................... 29/571 |
| 4,467,520 | 8/1984 | Shiotari ............................ 29/576 B |
| 4,472,871 | 9/1984 | Green et al. ........................ 29/571 |

FOREIGN PATENT DOCUMENTS 54-186832  2/1979  Japan .

OTHER PUBLICATIONS

Ogura et al., IEEE-Trans. Electron Devices, vol. ED-27 (1980), 1359.
Ohta et al., IEEE-Trans. Electron Devices, ED-27 (1980), 1352.

Primary Examiner—Upendra Roy
Attorney, Agent, or Firm—Maurice H. Klitzman; John E. Hoel; Jesse L. Abzug

[57] ABSTRACT

The process sequence is disclosed which applies a polycrystalline silicon gate material, then applies a chemical vapor deposition oxide over all surfaces, forming an effective sidewall on each of the polycrystalline silicon gate structures. An ion implantation step is then carried out to implant source and drain regions whose proximate edges are not aligned with the edges of the polycrystalline silicon gate material itself, due to the masking effect of the sidewall portion of the chemical vapor deposition oxide layer. Thereafter, the chemical vapor deposition oxide sidewall material is selectively removed for those FET device locations where an active FET device is desired to be formed in the operation of personalizing the read only storage or PLA product. Those locations are then ion implanted for source and drain extensions which are then self-aligned with the respective edges of the respective polycrystalline silicon gate electrodes. The process enables a significantly reduced turnaround time for personalizing read only memory arrays which contain FET memory devices having a shorter channel length, higher breakdown voltage characteristic, an almost zero channel hot electron effect, and a lower gate-to-source/drain diffusion overlap capacitance than most other FET read only memory devices.

1 Claim, 5 Drawing Figures

METHOD OF MAKING ROM/PLA SEMICONDUCTOR DEVICE BY LATE STAGE PERSONALIZATION

FIELD OF THE INVENTION

The invention disclosed broadly relates to semiconductor processing and more particularly relates to field effect transistor semiconductor processing and structures.

BACKGROUND OF THE INVENTION

Read only memory (ROM) and programmable logic array (PLA) integrated circuits are widely used in data processing systems. ROM and PLA integrated circuits typically store fixed information in binary form using electronic switching devices. The personalization of binary information is generally carried out by forming electronic devices which are either electrically conductive or electrically nonconductive. Each of these alternate states is established during the device's fabrication.

In state of the art Metal Oxide Silicon Field Effect Transistor (MOSFET) technologies, the personalization of the Field Effect Transistor (FET) is commonly done at the device gate level. Since the MOSFET's threshold voltage is directly proportional to the thickness of the gate insulator, an FET device with a gate insulator thickness equivalent to the thickness of the isolating field insulator, will be nonconducting when normal operating voltages are applied to the device. Such a device will constitute a first binary state. Those FET devices with a relatively thinner gate insulating layer, will be electrically conductive under the same operating voltages, and they will constitute a second binary state. U.S. Pat. No. 3,541,543 describes this technique for fabricating read only memory FET devices.

The personalization of the permanently stored binary state of read only memory or PLA FET devices is conventionally carried out by forming thick or thin gate insulator regions using photolithographic masking. For example, in selfaligned recessed oxide polycrystalline silicon gate MOSFET technologies, the thin gate insulator region is defined in the process. This method of read only memory personalization has the disadvantage that it requires a long turnaround time before a particular pattern of binary bits can be embodied in a final read only memory product. As a result, the development times for systems employing conventional FET read only memories is relatively long and engineering changes considerably lengthen the development cycle time for a product.

In order to reduce the turnaround time necessary to obtain a useable product incorporating a read only memory, an alternate method of ROM or PLA personalization is conventionally used which employs the ion implantation of semiconductor dopant ions to selectively change the conduction threshold voltage of the resultant FET device. An example of this technique is described in U.S. Pat. No. 4,142,176, wherein the personalization takes place after the thin gate insulating layer has been grown. However, even though the processing time for devices made in accordance with this process is reduced when compared with earlier methods, the overall turnaround time is still long.

Still another approach to reducing the overall turnaround time for fabricating ROM or PLA products with predefined permanent bit patterns, is to use metal interconnection line personalization. In this approach, the metal interconnection lines which are employed to interconnect the various devices on the integrated circuit chip, are established at a later time during the process cycle. In ROM and PLA products, a device which is intended to be an electrically conductive device, has its gate electrode connected to the word line by means of a metal interconnection line. Those devices which are not designated as conductive devices, do not have their gate electrodes so connected, but instead can have their gate electrode shorted to their source. The turnaround time necessary to obtain a finished product employing this method is reduced with respect to the previously described processes, however, since an additional gate electrode contact is required for each storage cell, the cell size increases significantly, thereby reducing the overall density of the ROM or PLA product.

A still further improved solution to reducing the overall turnaround time problem is to employ Electrically Erasable Programmable Read Only Memories (EEPROM). In this approach, the ROM or PLA device personality can be electrically changed over a period of several minutes to hours. An example of EEPROM cells is found in U.S. Pat. No. 4,334,292 to Koetcha. The EEPROM cells typically incorporate capacitors and therefore the cell size becomes relatively large, thereby reducing the overall density of the resultant memory product.

What is required is a practical technique for fabricating ROM and PLA products which has a superior turnaround time and yet results in a product having a high information density.

It is of further importance to provide FET devices which have a high switching speed in order to maximize the performance of the resultant ROM or PLA product. An example FET device structure which realizes such high performance characteristics is described in the publication Ogura, et al, "Design and Characteristics of the Lightly Doped Drain-Source (LDD) Insulated Gate Field Effect Transistor", *IEEE Transactions On Electron Devices*, August, 1980, pages 1359–1367. The LDD field effect transistor structure has reduced short channel effects by virtue of having a relatively lightly doped source and drain extensions adjacent to the gate region. This enables higher current driving characteristics for the resultant FET device with a lowered gate capacitance.

A further benefit in such device structures is the reduction in hot electron effects as described in Ogura, et al., "Elimination of Hot Electron Gate Current by the Lightly Doped Drain-Source Structure," *IEDM*-81, pages 651–654. In this reference, Ogura, et al. have an initial ion implantation step to form the lightly doped portions of source and drain adjacent to the edges of the gate, followed by the growth of silicon dioxide sidewalls which will serve as masks to limit the area of subsequent deep ion implantation to regions separated from the gate.

It would be desirable to have a process which could selectively provide Lightly Doped Drain (LDD) field effect transistor devices in those locations of a read only memory or PLA product, requiring devices having a conductive state and alternately to provide nonconductive FET devices in those locations of the ROM or PLA product which are desired to have a nonconductive state. A simplified fabrication process which would provide a pattern of selectively conductive and nonconductive LDD field effect transistor devices, which can be selectively personalized for their respective binary states at a relatively late stage in the fabrication process, would result in a high density read only memory or PLA product having a desirably fast turnaround time with a resultant conductive FET devices having high performance characteristics.

OBJECTS OF THE INVENTION

It is therefore an object of the invention to significantly reduce the turnaround time for personalizing a read only memory or programmable logic array.

It is still a further object of the invention to provide an improved process for making read only memory or programmable logic array FET devices which have a shorter channel length.

It is still a further object of the invention to provide a read only memory or programmable logic array cell that does not have a significantly higher fabrication costs.

It is still a further object of the invention to provide a process for making read only memory or programmable logic array FET devices which have a higher breakdown voltage characteristic.

It is yet a further object of the invention to provide an improved FET read only memory or programmable logic array fabrication process which provides devices with a substantially zero channel hot electron effect.

It is yet a further object of the invention to provide an improved process for making read only memory or programmable logic array FET devices which have a lower gate-to-source/drain diffusion overlap capacitance.

SUMMARY OF THE INVENTION

These and other objects, features and advantages of the invention are accomplished by the late personalization ROS/PLA process and the resultant structure described herein. A process sequence is disclosed which applies a polycrystalline silicon gate material and then applies a chemical vapor deposition oxide over all surfaces, forming an effective sidewall on each of the polycrystalline silicon gate structures. An ion implantation step is then carried out to implant source and drain diffusion regions whose proximate edges are not aligned with the edges of the polycrystalline silicon gate material itself, due to the masking effect of the sidewall portion of the chemical vapor deposition oxide layer. Thereafter, the chemical vapor deposition oxide sidewall material is selectively removed for those FET device locations where an active FET device is desired to be formed in the operation of personalizing the read only storage or PLA product. Those locations are then ion implanted for source and drain extensions which are then self-aligned with the respective edges of the respective polycrystalline silicon gate electrodes. The process enables a significantly reduced turnaround time for personalizing read only memory arrays which contain FET memory devices having a shorter channel length, higher breakdown voltage characteristic, an almost zero channel hot electron effect, a lower gate-to-source/drain diffusion overlap capacitance than most other FET read only memory devices, and finally, the memory cell size is not significantly larger so that the cost of fabrication is significantly reduced.

DESCRIPTION OF THE INVENTION

Figure 1:
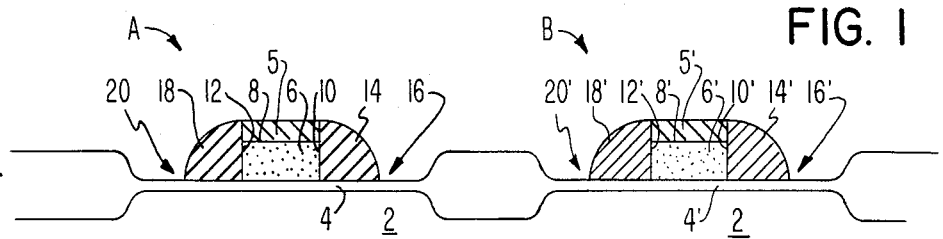
FIG. 1 shows two FET devices having insulator sidewall spacers at their respective polysilicon gate edges.

In the foregoing discussions, it was shown that the commonly used method to personalize the ROS/PLA array is making the FET device nonconductive by either adjusting the threshold voltage or by shorting the device gate to its source during processing. Among the techniques used to adjust the device threshold voltage is increasing the gate insulator thickness or ionimplantation during fabrication. Alternately, electron charge injection can be used after fabrication to alter the threshold voltage, as is the case for EEPROMs.

In accordance with the invention, a method is disclosed for making the FET device nonconductive by severing the connection between the device source or drain and the device channel region. In this way, when biases are applied to the device, no source to drain conduction takes place because the channel inversion layer has no electrical conductive path to the source or drain contact.

This invention incorporates the cited high performance Lightly Doped Drain-Source FET and proposes to make the device nonconductive by selectively masking the drain or source implanted extentions to the device channel. In this manner the connection between the source or drain and the channel inversion layer is severed.

In the cited prior art by Ogura, et al, to obtain the lightly doped ionimplanted source and drain, the areas adjacent to the edges of the gate are masked by either using insulator overhangs over a polysilicon gate electrode or using insulator sidewalls on the polysilicon gate edges. This masks out the deep source-drain ionimplants adjacent to the gate. In accordance with the invention, the process steps of Ogura, et al. are reversed so that silicon dioxide sidewalls are grown on the opposite edges of the polycrystalline silicon gate structure at a stage before any ion implantation is performed to create source or drain structures. Then, portions of the source and/or drain can be formed remote from the edges of the gate by deep ion implantation to make all of the FET devices in the ROM or PLA array initially nonconductive. The semiconductor wafer can then be stockpiled at this point. Later when a specific bit pattern is to be embodied in the ROM or PLA chips on the wafer, the process selectively etches out the masking sidewall insulator so that the lightly doped drain-source regions can be ion implanted to selectively form conductive FET devices. For the case where the masking sidewall insulator remains, the device will remain nonconductive.

When the personality data is available, the personality mask is used to form conductive/nonconductive devices. The subsequent process steps to complete the fabrication are significantly few compared to state-of-the-art techniques of threshold adjustment during processing. In addition, the resultant device size is not significantly increased since the added region for the lightly doped ionimplant is compensated by a reduced channel length. Further, since LDD devices can be used in all the circuitry, the final product can have channel hot electron immunity as well as improved circuit performance.

The following discussions pertain to the preferred embodiment of the invention.

DISCUSSION OF THE PREFERRED EMBODIMENT

To illustrate the application of this invention, consider the state-of-the-art FET self-aligned silicon gate semirecessed oxide technology. Briefly, the key process elements start with the definition of the semi-recessed oxide or ROX patterns using a photoresist and then adjusting the field region threshold voltage by ionimplanting the field region through windows in the photoresist. The field region is the regions surrounding and separate from the active device regions A and B where conductive and nonconductive FET devices will ultimately be formed. No ion implantation is yet conducted in the device regions A and B. The ROX is formed by oxidizing the silicon substrate 2 in the field region. After the gate silicon dioxide layer 4 is grown, a polysilicon gate structure 6 is patterned. The polysilicon typically forms the gate electrode 6 and also provides for interdevice wiring.

At this point, 10 to 500 nm of silicon dioxide layer is deposited conformally in a low pressure CVD system. The CVD silicon dioxide is next etched out using the directional reactive ion etch or RIE technique to remove the CVD silicon dioxide leaving a sidewall spacer 14 and 18 all around the edges of the polysilicon gate 6. The description to build the sidewall-spacers is disclosed in the U.S. Pat. No. 4,234,362 issued to Riseman. The further experimental work done by Tsang, et al, is published in the June 1981 issue of *Journal of the Electrochemical Society*, page 2380. The state of the device at this stage is shown in FIG. 1.

In the following description of the preferred process, the fabrication of both the conductive and nonconductive devices indicated in the figures as device A and B respectively, is described. The nonconductive device or device B formation is indicated using a prime for the reference numerals.

The disclosed process forms a read only memory FET device on a semiconductor substrate 2 of P-type conductivity type, having a gate insulator layer 4 deposited on the surface thereof with a polycrystalline silicon gate electrode 6 formed on the surface of the insulator layer 4, having a top surface 8 and first 10 and second 12 opposed sidewall surfaces 10 and 12.

FIG. 1 shows the step of growing the silicon dioxide masking layer on the polycrystalline silicon gate electrode 6 with a first portion 14 thereof covering the first sidewall 10 and having an exposed surface forming a first edge 16 and a second portion 18 thereof covering the second sidewall 12 and having an exposed surface forming a second edge 20, to serve as an ion implantation blocking mask. This insulating masking layer is formed using the cited teachings of U.S. Pat. No. 4,234,362.

Figure 2:
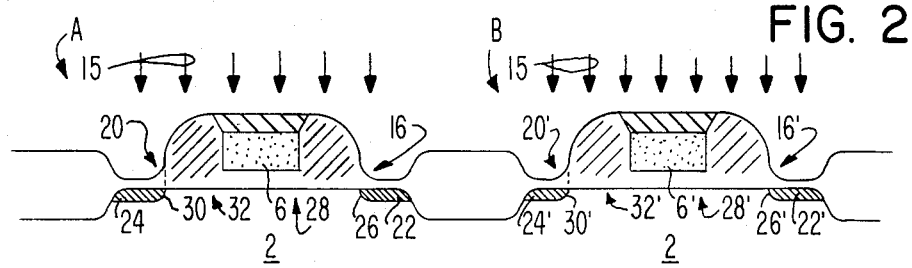
FIG. 2 shows the contact diffused source-drain ion-implantation step where the sidewall-spacers block the ionimplant.

FIG. 2 shows the second step of ion implanting 15 a source 22 and a drain 24 region of N-type conductivity into the semiconductor substrate 2, the first portion 14 of the masking layer blocking ion implantation into the substrate 2 adjacent to the first sidewall 10 and the second portion 18 of the masking layer blocking ion implantation into the substrate 2 adjacent to the second sidewall 12.

As is seen in FIG. 2, the source region 22 has a first terminal edge 26 aligned with the first edge 16 of the silicon dioxide masking layer and separated by a first nonimplanted region 28 in the substrate 2 from alignment with the first sidewall 10 of the gate electrode 6 by the thickness of the first portion 14 of the the masking layer. The drain region 24 has a first terminal edge 30 aligned with the second edge 20 of the silicon dioxide masking layer and separated by a second nonimplanted region 32 in the substrate 2 from alignment with the second side 12 of the gate electrode 6 by the thickness of the second portion 18 of the masking layer, the first and second nonimplanted regions 28 and 32 preventing FET action for the devices of FIG. 2 at this point in the process. The wafers can now be stock-piled ready to be personalized. When a given personality is required, the personality mask photo lithography is carried out as is shown in FIGS. 3, 4 and 5.

Figure 3:
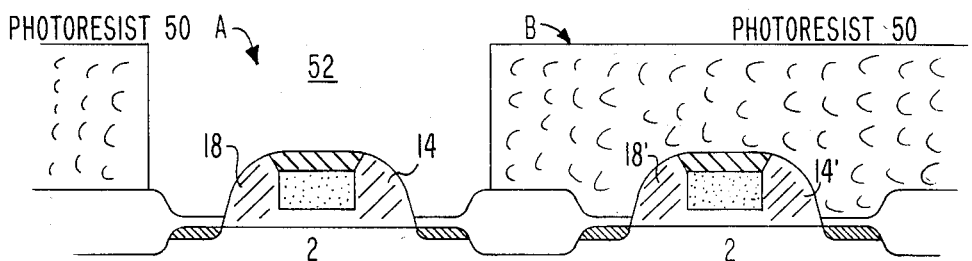
FIG. 3 shows the structure of FIG. 2 when a personality mask pattern in photoresist exposes the conductive device "A" for etching out the sidewall-spacers and blocking the etching of the sidewall-spacers of the non-conductive device "B".

FIG. 3 shows how personalization takes place with a third step of selectively removing by wet chemical techniques, the first 14 and second 18 portions of the silicon dioxide masking layer from the first 10 and second 12 sidewalls of the polycrystalline silicon gate electrode 6 of device A, exposing the first 28 and second 32 nonimplanted regions in the substrate 2. Device B is covered with the photoresist and therefore the ionimplant masking sidewall-spaces remain intact.

Figure 4:
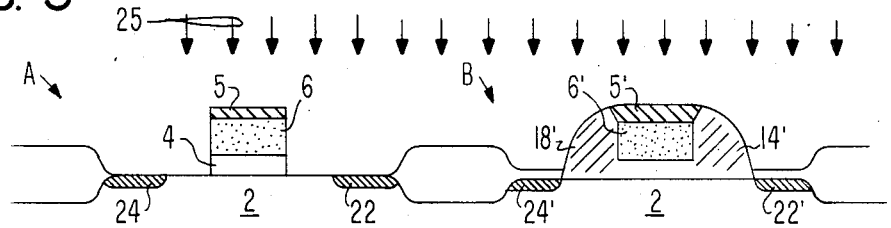
FIG. 4 shows the result of sidewall-spacer etching. The lightly doped ionimplantation step is now carried out. Due to the presence of sidewall-spacers, the device "B" is not implanted, and thus remains non-conductive.
Figure 5:
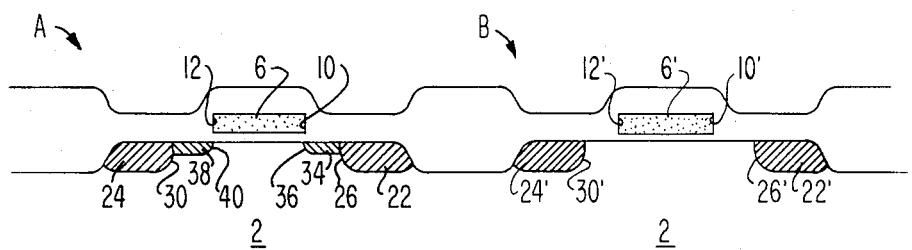
FIG. 5 shows the devices after heat treatment and oxidation.

FIG. 4 and FIG. 5 also show a fourth step of ion implanting 25 a source extension 34 of N-type conductivity in the first nonimplanted region 28 exposed by the selective removal step, extending the source region 22 from the first terminal edge 26 thereof to a second terminal edge 36 aligned with the first sidewall 10 of the gate electrode 6 and ion implanting a drain extension 38 of N-type conductivity in the second nonimplanted region 32 exposed by the selective removal step, extending the drain region 24 from the first terminal edge 30 thereof to a second terminal edge 40 aligned with the second sidewall 12 of the gate electrode 6. This is done for selectively enabling FET action for the device A of FIG. 5, thereby selectively representing a first stored binary state. Since in device B, sidewall-spacers 14' and 18' mask the ion implant extensions, this device is nonconductive representing the second stored binary state. In FIG. 5, all silicon surfaces are thermally oxidized.

In this manner, the read only memory or programmable logic array FET device can have its binary state selectively programmed at a relatively late stage of its fabrication. Subsequent steps can be carried out for forming ohmic contacts and metal wiring, passivation layer deposition, terminal metals, testing and packaging.

Although a specific embodiment of the invention has been disclosed, it will be understood by those of skill in the art that the foregoing and other changes in form and details may be made therein without departing from the spirit and the scope of the invention.

Having thus described our invention, what we claim as new, and desire to secure by Letters Patent is:

1. A process for forming a FET memory on a semiconductor substrate of a first conductivity type, having a gate insulator layer deposited on the surface thereof with a polycrystalline silicon gate electrode formed on the surface of said insulator layer, having a top surface and first and second opposed sidewall surfaces, comprising the steps of:

growing a silicon dioxide masking layer on said polycrystalline silicon gate electrode with a first portion thereof covering said first sidewall and having an exposed surface forming a first edge and a second portion thereof covering said second sidewall and having an exposed surface forming a second edge, to serve as an ion implantation blocking mask;

ion implanting a source and a drain region of a second conductivity type into said semiconductor substrate, said first portion of said masking layer blocking ion implantation into said substrate adjacent to said first sidewall and said second portion of said masking layer blocking ion implantation into said substrate adjacent to said second sidewall;

said source region having a first terminal edge aligned with said first edge of said silicon dioxide masking layer and separated by a first nonimplanted region in said substrate from alignment with said first sidewall of said gate electrode by the thickness of said first portion of said masking layer and said drain region having a first terminal edge aligned with said second edge of said silicon dioxide masking layer and separated by a second nonimplanted region in said substrate from alignment with said second side of said gate electrode by the thickness of said second portion of said masking layer, said first and second nonimplanted regions preventing FET action for the device, thereby representing a first stored binary state;

selectively removing said first and second portions of said silicon dioxide masking layer from said first and second sidewalls of said polycrystalline silicon gate electrode, exposing said first and second nonimplanted regions in said substrate;

ion implanting a source extension of said second conductivity type in said first nonimplanted region exposed by said selective removal step, extending said source region from said first terminal edge thereof to a second terminal edge aligned with said first sidewall of said gate electrode and ion implanting a drain extension of said second conductivity type in said second non-implanted region exposed by said selective removal step, extending said drain region from said first terminal edge thereof to a second terminal edge aligned with said second sidewall of said gate electrode, for selectively enabling FET action for the device, thereby selectively representing a second stored binary state;

whereby the FET memory device can have its binary state selectively programmed at a relatively late stage of its fabrication.

* * * * *